US010460785B1

(12) United States Patent
Lee et al.

(10) Patent No.: US 10,460,785 B1
(45) Date of Patent: Oct. 29, 2019

(54) PARALLEL WRITE SCHEME UTILIZING SPIN HALL EFFECT-ASSISTED SPIN TRANSFER TORQUE RANDOM ACCESS MEMORY

(71) Applicant: QUALCOMM Incorporated, San Diego, CA (US)

(72) Inventors: Hochul Lee, Los Angeles, CA (US); Chando Park, Palo Alto, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/011,866

(22) Filed: Jun. 19, 2018

(51) Int. Cl.
*G11C 11/16* (2006.01)
*H01L 27/22* (2006.01)
*H01L 43/04* (2006.01)
*G11C 11/18* (2006.01)
*G11C 11/02* (2006.01)

(52) U.S. Cl.
CPC .......... *G11C 11/1675* (2013.01); *G11C 11/02* (2013.01); *G11C 11/16* (2013.01); *G11C 11/1655* (2013.01); *G11C 11/1657* (2013.01); *G11C 11/1659* (2013.01); *G11C 11/1673* (2013.01); *G11C 11/1693* (2013.01); *G11C 11/18* (2013.01); *H01L 27/226* (2013.01); *H01L 43/04* (2013.01)

(58) Field of Classification Search
CPC ....... G11C 11/18; G11C 11/02; G11C 11/065; G11C 11/16; G11C 11/1675; G11C 11/1693
See application file for complete search history.

(56) References Cited

U.S. PATENT DOCUMENTS

| 8,456,895 B2* | 6/2013 | Abraham ............ G11C 11/1675 365/158 |
| 9,881,660 B2* | 1/2018 | Yoda .................... G11C 11/1675 |
| 10,008,248 B2* | 6/2018 | Buhrman ................ H01L 43/08 |
| 10,026,465 B2* | 7/2018 | Inokuchi ................ G11C 11/161 |
| 10,102,894 B2* | 10/2018 | Shimomura ........ G11C 11/1657 |
| 10,224,368 B2* | 3/2019 | Li ........................ G11C 11/1655 |

(Continued)

OTHER PUBLICATIONS

Ibrahim Ahmed et al. "A Comparative Study Between Spin-Transfer-Torque and Spin-Hall-Effect Switching Mechanisms in PMTJ Using SPICE", Department of Electrical and Computer Engineering, University of Minnesota, IEEE, vol. 3 Jul. 10, 2017.

(Continued)

Primary Examiner — Vanthu T Nguyen
(74) Attorney, Agent, or Firm — Qualcomm Incorporated (57) ABSTRACT

A magnetoresistive random access memory (MRAM) and associated apparatus and methods are described. The MRAM generally includes a heavy metal layer coupled to a source line, and a plurality of bit cells coupled to a word line, a plurality of bit lines, and the heavy metal layer, such that the heavy metal layer is a continuous layer coupling the bit cells to the source line, wherein each of the bit cells comprises a magnetic tunnel junction (MTJ) and a transistor, a gate of the transistor being coupled to the word line, and at least one of a source or a drain of the transistor being coupled to the MTJ or at least one of the bit lines.

11 Claims, 6 Drawing Sheets

(56) References Cited

U.S. PATENT DOCUMENTS

2014/0056060 A1\* 2/2014 Khvalkovskiy ....... H01L 27/228
                                                      365/158
2019/0088860 A1\* 3/2019 Saito ...................... H01L 43/08

OTHER PUBLICATIONS

Behzad Zeinali et al. "Ultra-Fast SOT-MRAM Cell with STT Current for Deterministic Switching" 2017 IEEE 35th International Conference on Computer Design, DOI 10.1109/ICCD 2017.81.

\* cited by examiner

Applying a first voltage to at least a portion of the heavy metal layer and a second voltage lower than the first voltage at another portion of the heavy metal layer, such that free layers of magnetic tunnel junctions (MTJs) of the bit cells are magnetized via a spin Hall effect of the heavy metal layer

404

Applying at least one of a third voltage to the heavy metal layer and a fourth voltage to at least one of the bit lines, such that the free layer of the MTJ coupled to the at least one of the bit lines is magnetized in a first direction relative to a fixed layer of the MTJ coupled to the at least one of the bit lines via spin transfer torque (STT), or the third voltage to the heavy metal layer and a fifth voltage to at least one of the bit lines, such that the free layer of the MTJ coupled to the at least one of the bit lines is magnetized in a second direction relative to the fixed layer of the MTJ coupled to the at least one of the bit lines via STT

PARALLEL WRITE SCHEME UTILIZING SPIN HALL EFFECT-ASSISTED SPIN TRANSFER TORQUE RANDOM ACCESS MEMORY

BACKGROUND

Field of the Disclosure

Aspects of the present disclosure relate to random access memory (RAM), and more particularly, to techniques for writing to Magnetoresistive Random Access Memory (MRAM) using a Spin Hall effect (SHE) to assist in modifying a magnetic layer of a magnetic tunnel junction during a spin transfer torque (STT) operation.

Description of Related Art

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. A magnetic tunnel junction (MTJ) storage element can be formed from two magnetic layers, each of which can hold a magnetic field, separated by an insulating (tunnel barrier) layer. One of the two layers (e.g., fixed layer), is set to a particular polarity. The other layer's (e.g., free layer) polarity is free to change to match that of an external field that can be applied. A change in the polarity of the free layer will change the resistance of the MTJ storage element. For example, when the polarities are aligned, a low resistance state exists. When the polarities are not aligned, then a high resistance state exists. Those skilled in the art will appreciate that each layer illustrated may comprise one or more layers of materials, as is known in the art.

MRAM has several desirable characteristics that make it a candidate for a universal memory, such as high speed, high density (i.e., small bit cell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. However, as the demand for more capacity, lower power requirements, and faster switching times continues to increase, there exists a need for further improvements in STT-MRAM technologies.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved writing operations for MRAM.

Certain aspects provide magnetoresistive random access memory (MRAM). The MRAM generally includes a heavy metal layer coupled to a source line, and a plurality of bit cells coupled to a word line, a plurality of bit lines, and the heavy metal layer, such that the heavy metal layer is a continuous layer coupling the bit cells to the source line, wherein each of the bit cells comprises a magnetic tunnel junction (MTJ) and a transistor, a gate of the transistor being coupled to the word line, and at least one of a source or a drain of the transistor being coupled to the MTJ or at least one of the bit lines.

Certain aspects provide an apparatus having MRAM configured to perform the SHE-assisted STT writing operation. The apparatus generally includes a magnetoresistive random access memory (MRAM), comprising a heavy metal layer coupled to a source line, and a plurality of bit cells coupled to a word line, and a plurality of bit lines, and the heavy metal layer, such that the heavy metal layer is a continuous layer coupling the bit cells to the source line, wherein each of the bit cells comprises a magnetic tunnel junction (MTJ) and a transistor, a gate of the transistor being coupled to the word line, and at least one of a source or a drain of the transistor being coupled to the MTJ or at least one of the bit lines.

Certain aspects provide a method of writing to a magnetoresistive random access memory (MRAM) comprising a plurality of bit cells coupled to a word line, a plurality of bit lines, and a heavy metal layer, such that the heavy metal layer is a continuous layer coupling the bit cells to a source line. The method generally includes applying a first voltage to at least a portion of the heavy metal layer and a second voltage lower than the first voltage at another portion of the heavy metal layer, such that free layers of magnetic tunnel junctions (MTJs) of the bit cells are magnetized via a spin Hall effect of the heavy metal layer. The method also includes applying at least one of a third voltage to the heavy metal layer and a fourth voltage to at least one of the bit lines, such that the free layer of the MTJ coupled to the at least one of the bit lines is magnetized in a first direction relative to a fixed layer of the MTJ coupled to the at least one of the bit lines via spin transfer torque (STT), or the third voltage to the heavy metal layer and a fifth voltage to at least one of the bit lines, such that the free layer of the MTJ coupled to the at least one of the bit lines is magnetized in a second direction relative to the fixed layer of the MTJ coupled to the at least one of the bit lines via STT.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Aspects of the present disclosure provide apparatus, MRAM, and methods for writing to MRAM using a Spin Hall effect to assist in modifying a magnetic layer of a magnetic tunnel junction during a spin transfer torque operation.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Example Parallel Write Scheme for Stt-Mram

As indicated above, challenges with STT-MRAM are the high write energy and insufficient switching speed, which are barriers to implementing STT-MRAM in embedded system memory applications (e.g., SoCs or ASICs in wireless communication devices). To achieve a nanosecond switching time via STT, the write current needs to be exponentially increased, which in turn requires a large size access transistor, limiting the cell array density. For example, switching times achieved for STT-MRAM are greater than 10 nanoseconds with write energies exceeding 100 fJ. The spin Hall effect (SHE) enables nanosecond switching with a moderate current by reducing the incubation time. However, in case of controlling perpendicular MTJ, SHE requires an external magnetic field to break the symmetry for realizing a deterministic switching, and thus limiting the cell array density. The present disclosure provides a parallel write scheme for STT-MRAM that utilizes a SHE-assisted STT operation in an array level, providing low write energy, high-density, and high-throughput. This may enable the STT-MRAM to provide switching times and write energies suitable for embedded memory applications.

Figure 1:
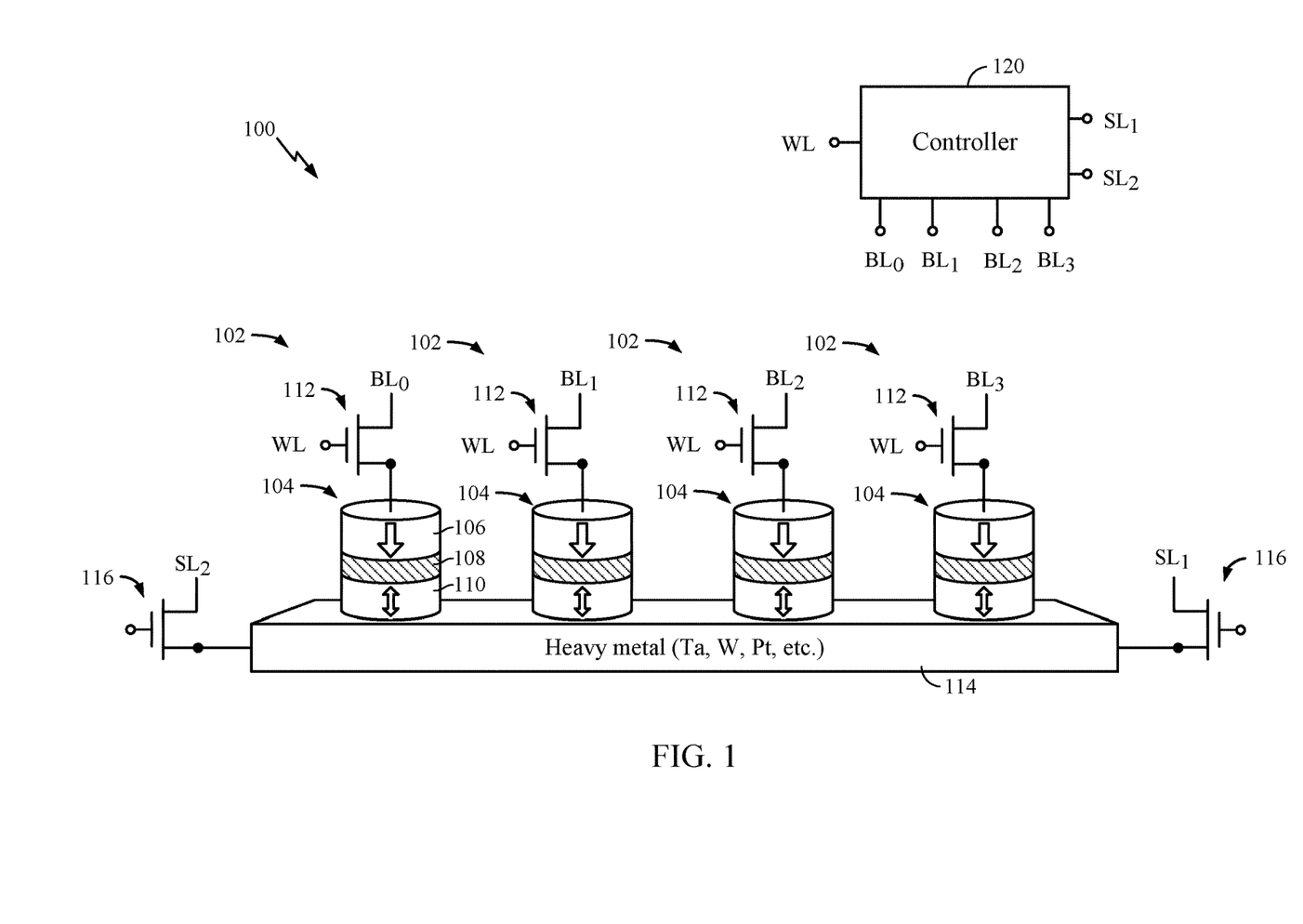
FIG. 1 is a schematic illustrating an example Spin Hall Effect (SHE)-assisted STT-MRAM, in accordance with certain aspects of the present disclosure.

FIG. 1 illustrates a schematic view of an example STT-MRAM, in accordance with certain aspects of the present disclosure. As shown, the STT-MRAM 100 includes a plurality of bit cells 102 and a heavy metal layer 114. The bit cells 102 and heavy metal layer 114 represent an example word line column, which be implemented in an MRAM cell array structure having multiple word line columns and bit line rows. In certain aspects, the number of bit cells per word line may vary depending on, for example, the impedance of the heavy metal layer 114 and available supply voltage. For instance, although four bit cells 102 are depicted in FIG. 1, a word line may have 2, 4, 8, 16, 32, or more bit cells.

The bit cells 102 are coupled to a word line WL, a plurality of bit lines $BL_0$-$BL_3$, and the heavy metal layer 114. Each of the bit cells 102 includes a magnetic tunnel junction 104 (MTJ) having a magnetically fixed layer 106 (i.e., pinned or reference layer) and a magnetically free layer 110. The fixed layer 106 and the free layer 110 may be separated by a non-magnetic spacer layer 108. The magnetization orientation of the fixed layer 106 is pinned in a predetermined direction (as indicated by the single-headed arrow) while the magnetization orientation of the free layer 110 is free to rotate (as indicated by the double-headed arrow). The magnetization orientations of the free layer 110 and fixed layer 106 may be either parallel or anti-parallel relative to each other. Each free layer 110 of the MTJs 104 is coupled to the heavy metal layer 114.

Each of the bit cells 102 also includes a transistor 112 that couples the MTJ 104 to a word line WL and one of the bit lines $BL_0$-$BL_3$. A gate of the transistor 112 is coupled to the word line WL, and at least one of a source or a drain of the transistor 112 is coupled to the MTJ 104 or at least one of the bit lines $BL_0$-$BL_3$, depending on the current direction through the MTJ 104. The transistors 112 may be used to control the voltage applied to the MTJs 104 during the SHE-assisted STT write operation as further described herein The heavy metal layer 114 is coupled to a source line $SL_1$, $SL_2$ via transistors 116. The heavy metal layer 114 is a continuous layer or continuous strip of metal coupling the bit cells 102 to the source line $SL_1$, $SL_2$. That is, the bits cells 102 are coupled in parallel via the heavy metal layer 114, which may be a continuous strip of metal. The heavy metal layer 114 may include a heavy metal such as tantalum (Ta), tungsten (W), platinum (Pt), any other suitable heavy metal, or a combination thereof. The transistors 116 may be used to control the voltage applied to the heavy metal layer 114 during the SHE-assisted STT write operation as further described herein.

The STT-MRAM 100 may also include a controller 120 configured to write values to the MTJs 104 via SHE-assisted STT writing operations as further described herein. The controller 120 may have output terminals coupled to the corresponding word line WL, bit lines $BL_0$-$BL_3$, and source line $SL_1$, $SL_2$ to apply control signals to the bit cells 102 and heavy metal layer 114. The controller 120 may be a processor, a microcontroller, an application specific integrated circuit (ASIC), a field programmable gate array (FPGA) or other programmable logic device (PLD), discrete gate or transistor logic, or a combination thereof.

Figure 2:
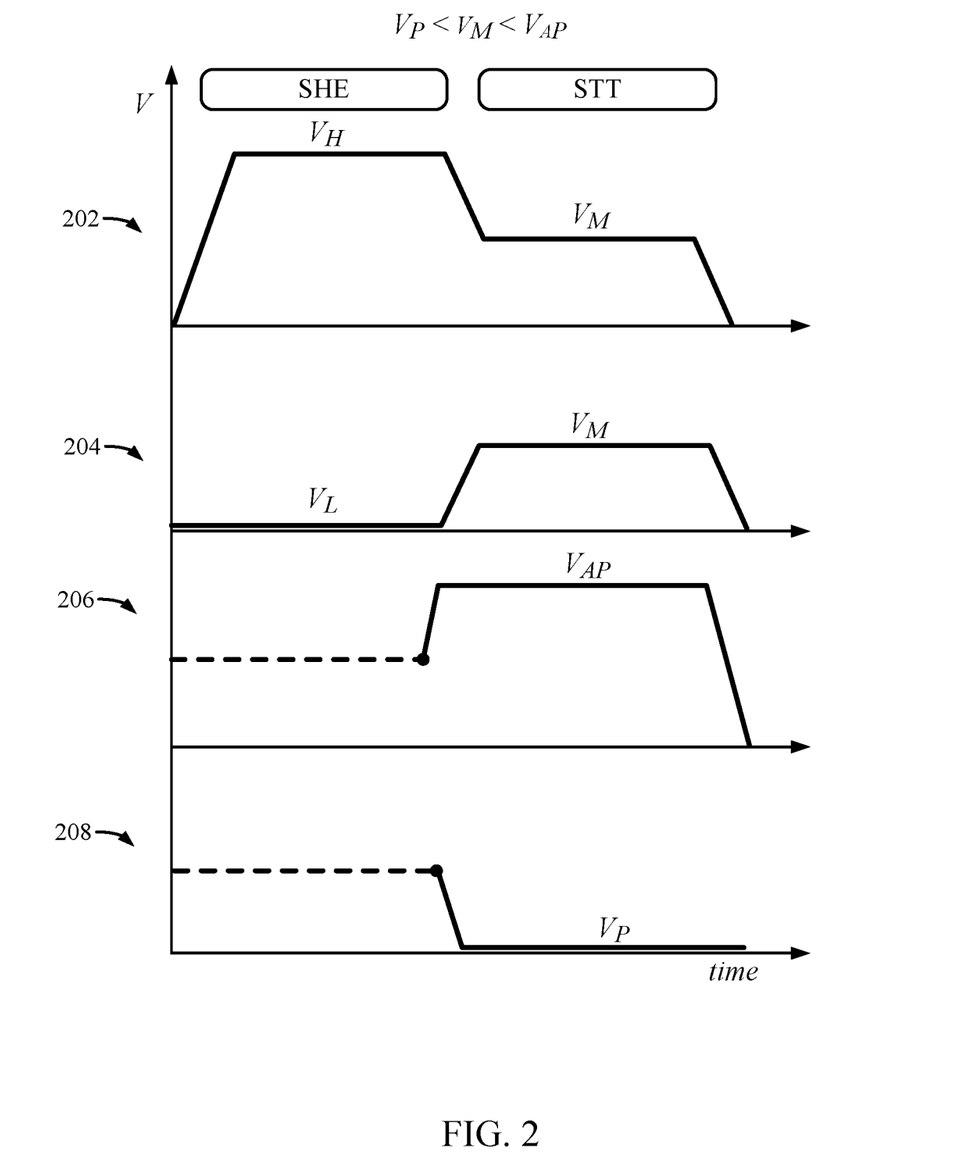
FIG. 2 is a diagram illustrating example writing operations for the SHE-assisted STT-MRAM, in accordance with certain aspects of the present disclosure.

FIG. 2 illustrates timing diagrams of example writing operations for STT-MRAM (e.g., STT-MRAM 100), in accordance with certain aspects of the present disclosure. As shown, the timing diagrams 202, 204, 206, 208 represent functions of voltage with respect to time. The timing diagrams 202, 204, 206, 208 demonstrate that the write operation may undergo an initial SHE phase followed by an STT phase. The voltages $V_H$, $V_L$, $V_M$, $V_{AP}$, and $V_P$ are control signals applied to the heavy metal layer or the bit cells used to apply an SHE to the heavy metal layer and assist an STT writing operation. The timing diagrams 202, 204 illustrate the voltages ($V_H$, $V_L$, $V_M$) applied to the heavy metal layer during the SHE and STT phases. The timing diagram 206 illustrates an example voltage ($V_{AP}$) applied to one of the bit cells to rotate the magnetization of the free layer to a first direction (e.g., an anti-parallel magnetization) during the STT phase. The timing diagram 208 illustrates an example voltage ($V_P$) applied to one of the bit cells to rotate the magnetization of the free layer to a second direction (e.g., a parallel magnetization) during the STT phase.

As illustrated in FIG. 2, the SHE phase is initially performed to partially rotate the magnetization of the free layer, for example, to an in-plane level, which enables less write energy and write time to be used to complete the rotation of the free layer during the STT phase. For example, during the SHE phase, the voltage $V_H$ may be applied to a portion of the heavy metal layer (such as $SL_1$), and the voltage $V_L$ may be applied to another portion of the heavy metal layer (such as $SL_2$). The current conducted through the heavy metal layer may induce an SHE in the free layer to rotate the magnetization of the free layer, for example, to an in-plane level.

After the magnetization of the free layer is partially rotated during the SHE phase, voltages $V_{AP}$ or $V_P$ may be applied to the MTJs to continue the rotation of the magnetization of the free layers utilizing the effect of STT. For example, during the STT phase, the voltage $V_M$ may be applied to the heavy metal layer (such as $SL_1$ and $SL_2$) to provide a reference voltage to the MTJs and enables the MTJs to conduct current in a direction depending on the bit line control signals $V_{AP}$, and $V_P$. The voltage $V_{AP}$ may be applied to one of the bit lines ($BL_0$-$BL_3$) to rotate the magnetization of the free layer to a first direction (e.g., an anti-parallel magnetization). The voltage $V_P$ may also be applied to one of the bit lines ($BL_0$-$BL_3$) to rotate the magnetization of the free layer to a second direction (e.g., an anti-parallel magnetization). Thus, the current may flow in one direction across an MTJ when the voltages $V_{AP}$ and $V_M$ are applied to a bit cell, whereas the current flows in another direction across the MTJ when the voltages $V_P$ and $V_M$ are applied to the bit cell. In addition, a control signal via the word line (e.g., WL of FIG. 1) is applied to the gate of transistors (e.g., transistor 112) coupled to the MTJs to select the column of bit cells for the writing operation during the STT phase.

As depicted in FIG. 2, the voltage $V_L$ (e.g., ~0 V) is less than the voltage $V_H$ (e.g., ~1 V); the voltage $V_M$ (e.g., ~0.5 V) is less than the voltage $V_{AP}$ (e.g., ~1 V), and the voltage $V_P$ (e.g., ~0 V) is less than the voltage $V_M$ (e.g., ~0.5 V). In certain aspects, different voltage levels for voltages $V_H$, $V_L$, $V_M$, $V_{AP}$, and $V_P$ may be used to conduct the SHE-assisted STT writing operation described herein. For example, the voltage $V_{AP}$ and $V_P$ may be swapped depending on how the magnetization of the fixed layer is oriented. That is, $V_M$ may be less than the voltage $V_P$, and the voltage $V_{AP}$ may be less than the voltage $V_M$. Further, although $V_H$ and $V_{AP}$ are depicted in FIG. 2 as being at similar voltage levels, these voltages may vary depending on the impedance characteristics of the heavy metal layer, the available supply voltages, or other factors to achieve the SHE-assisted STT writing operation as described herein. Likewise, $V_L$ and $V_P$ may also vary from the voltage levels depicted in FIG. 2.

Figure 3A:
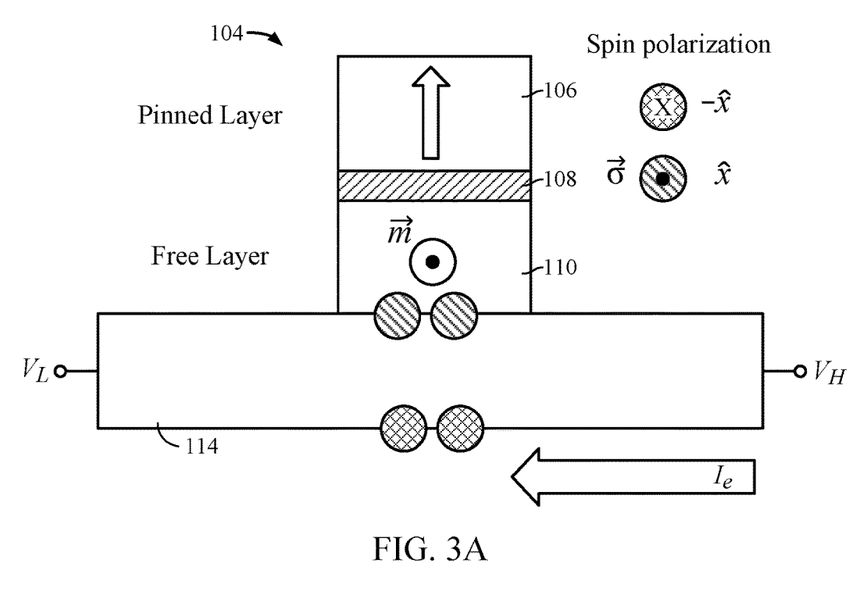
FIG. 3A illustrates a diagram view of an example MTJ partially rotating the magnetization of the free layer, in accordance with certain aspects of the present disclosure.

FIG. 3A illustrates a diagram view of an example MTJ for partially rotating the magnetization of the free layer, in accordance with certain aspects of the present disclosure. As shown, voltages $V_H$ and $V_L$ are initially applied to the heavy metal layer 114 to induce spin accumulation at the lateral boundaries of the heavy metal layer 114 (i.e., the SHE is applied to the heavy metal layer 114). This spin accumulation magnetically polarizes the heavy metal layer 114 and partially rotates the magnetization of the free layer 110. As illustrated in FIG. 3A, the magnetization of the free layer 110 may be oriented orthogonal to the current direction. For example, the magnetization of the free layer 110 may be oriented with x̂ or -x̂, as shown in FIG. 3A, depending on the current direction. This partial rotation of the magnetization of the free layer 110 enables faster writes and less write energy during the STT phase as depicted in FIGS. 3B and C.

Figure 3B:
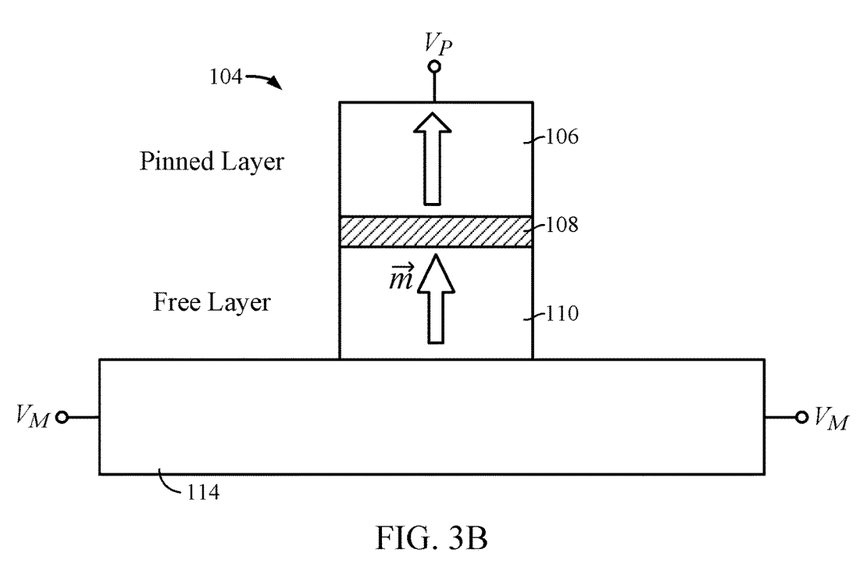
FIG. 3B illustrates a diagram view of an example MTJ for modifying the free layer to a first direction relative to the magnetization of the fixed layer (e.g., parallel magnetization), in accordance with certain aspects of the present disclosure.
Figure 3C:
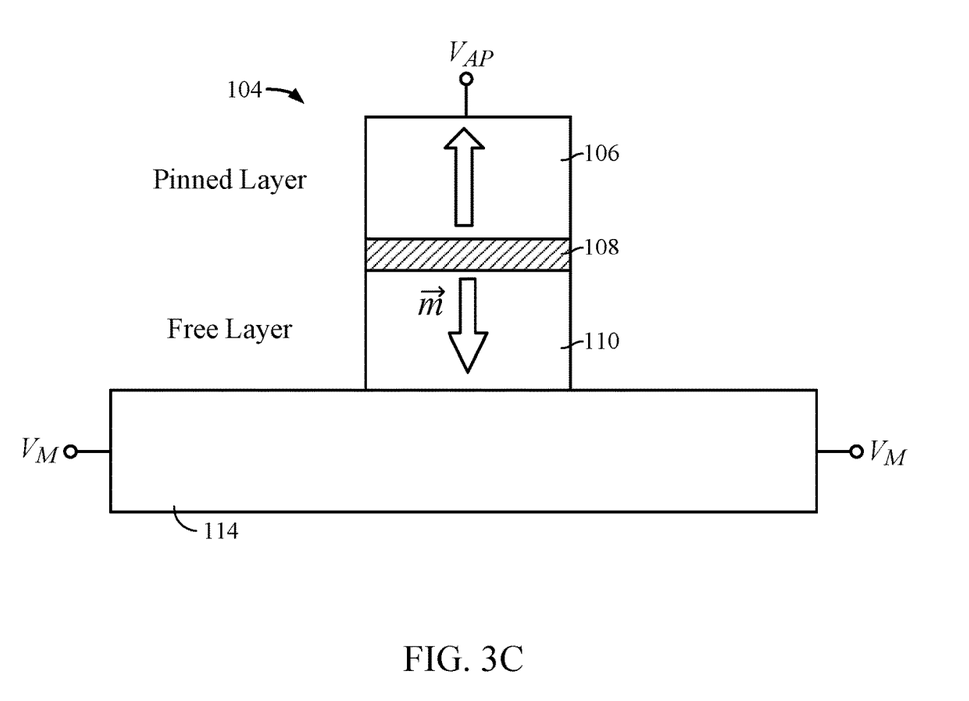
FIG. 3C illustrates a diagram view of an example MTJ for modifying the free layer to a second direction relative to the magnetization of the fixed layer (e.g., anti-parallel magnetization), in accordance with certain aspects of the present disclosure.

FIG. 3B illustrates a diagram view of an example MTJ for modifying the free layer to a first direction relative to the magnetization of the fixed layer (e.g., parallel magnetization), in accordance with certain aspects of the present disclosure. As shown, after the SHE phase, the voltage $V_M$ is applied to the heavy metal layer 114 to provide a reference voltage that enables current to be conducted through the MTJ 104. The voltage $V_P$ is applied to the MTJ 104 to conduct current in a direction that rotates the magnetization of the free layer in the first direction relative to the magnetization of the fixed layer 106. In this example, the magnetization of the free layer 110 is rotated to have a parallel magnetization relative to the fixed layer 106.

FIG. 3C illustrates a diagram view of an example MTJ for modifying the free layer to a second direction relative to the magnetization of the fixed layer (e.g., anti-parallel magnetization), in accordance with certain aspects of the present disclosure. As discussed above, the voltage $V_M$ provides a reference voltage that enables current to be conducted through the MTJ 104. The voltage $V_{AP}$ is applied to the MTJ 104 to conduct current in a direction that rotates the magnetization of the free layer in the second direction relative to the magnetization of the fixed layer 106. In this example, the magnetization of the free layer 110 is rotated to have an anti-parallel magnetization relative to the fixed layer 106.

FIGS. 3A-C illustrate example SHE-assisted STT writing operations for a single MTJ. The writing operations described herein with respect to FIGS. 3A-C are also applicable to multiple MTJs coupled in parallel via the heavy metal layer such as the bit cells depicted in FIG. 1.

Figure 4:
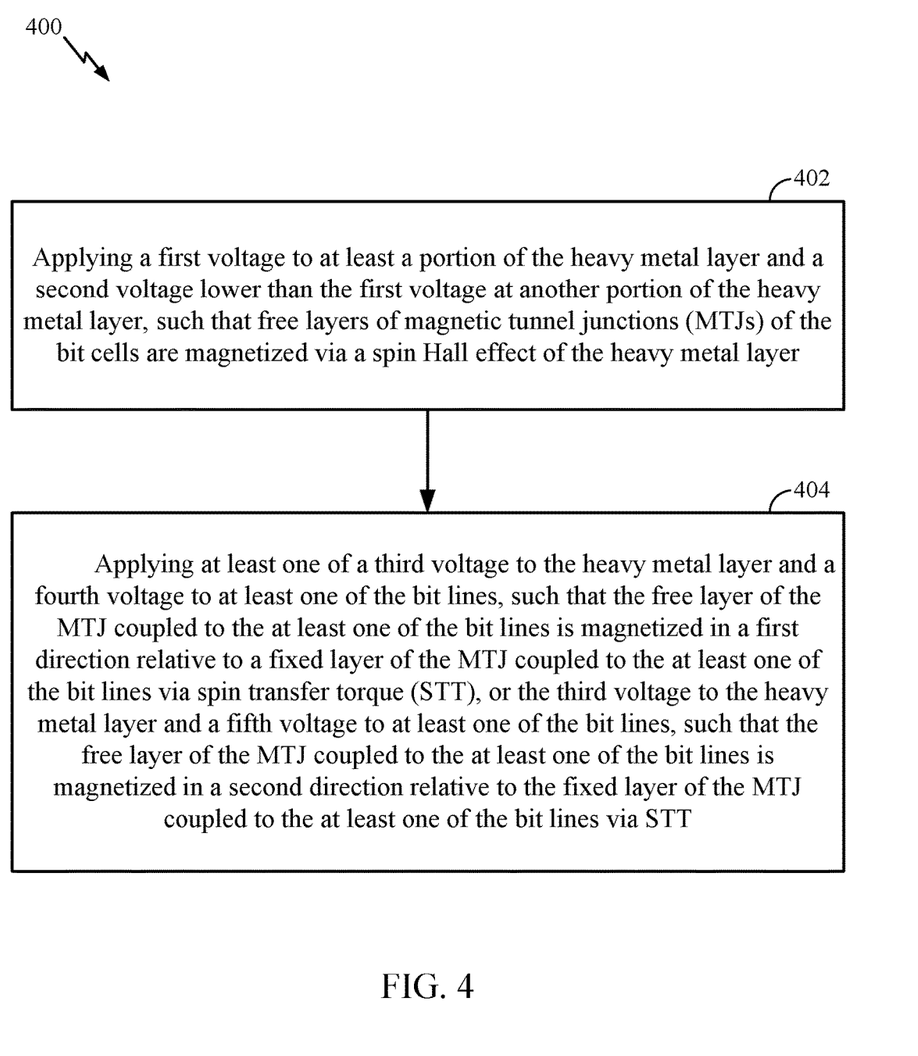
FIG. 4 is a flow diagram of example operations for writing to STT-MRAM utilizing the SHE-assisted STT technique described herein, in accordance with certain aspects of the present disclosure.

FIG. 4 is a flow diagram of example operations for writing to STT-MRAM utilizing the SHE-assisted STT technique described herein, in accordance with certain aspects of the present disclosure. The operations 400 may be performed, for example, by a controller (e.g., controller 120) coupled to the STT-MRAM to conduct the writing operation.

The operations 400 may begin, at 402, where the controller applies a first voltage to at least a portion of the heavy metal layer and a second voltage lower than the first voltage at another portion of the heavy metal layer, such that free layers of magnetic tunnel junctions (MTJs) of the bit cells are magnetized via a spin Hall effect of the heavy metal layer. At 404, the controller applies a third voltage to the heavy metal layer via the source line, and the controller may apply a fourth voltage to at least one of the bit lines, such that the free layer of the MTJ coupled to the at least one of the bit lines is magnetized in a first direction relative to a fixed layer of the MTJ coupled to the at least one of the bit lines via spin transfer torque (STT). At 404, the controller may also apply a fifth voltage to at least one of the bit lines, such that the free layer of the MTJ coupled to the at least one of the bit lines is magnetized in a second direction relative to the fixed layer of the MTJ coupled to the at least one of the bit lines via STT.

Figure 5:
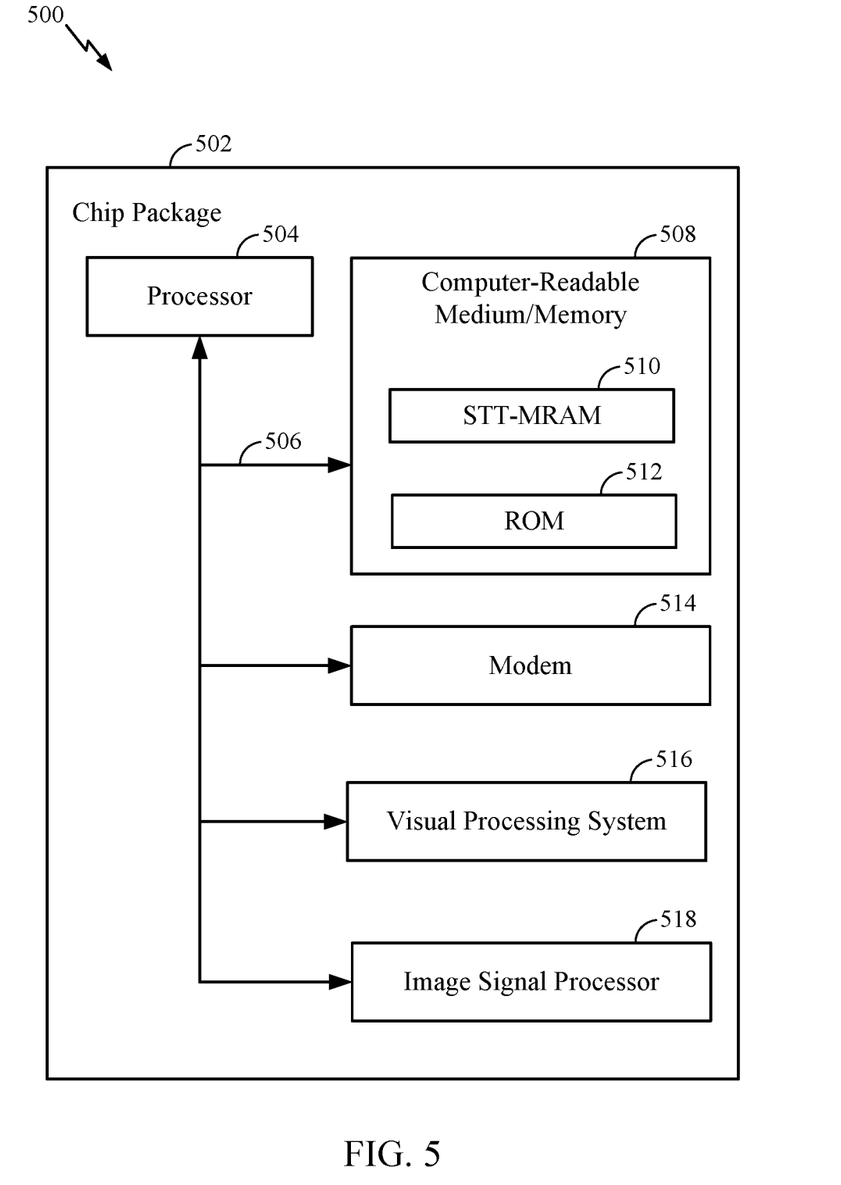
FIG. 5 illustrates an example system-on-chip (SOC) that may include various components configured to perform the writing operations disclosed herein, in accordance with certain aspects of the present disclosure.

In certain aspects, the SHE-assisted STT MRAM may be packaged on a stand alone memory chip or an integrated circuit having a processing system. For example, FIG. 5 illustrates an example system-on-chip (SoC) 500 that may include various components configured to perform the writing operations disclosed herein, such as the SHE-assisted STT writing operations illustrated in FIG. 4. The SoC 500 includes a chip package 502 having a processor 504 coupled to a computer-readable medium/memory 508 via a bus 506. In certain aspects, the computer-readable medium/memory 1012 may include STT-MRAM 510 and read-only memory 512 (ROM). The STT-MRAM 510 is configured to perform the SHE-assisted STT writing operation discussed herein.

The processor 504 may also be coupled to a modem 514, a visual processing system 516, and an image signal processor 518 via the bus 506. In certain aspects, these components may vary depending on the application of the SoC 500. For instance, the SoC 500 may lack a visual processing system 516 and/or an image signal processor 518 for internet of things (IoT) applications.

The SHE-assisted STT-MRAM provides various improvements over conventional STT-MRAM. The SHE-assisted STT-MRAM described herein may enable a reduction in the write current for the STT phase, which facilitates the use of smaller access transistors (e.g., transistors 112) and increases the density of the MRAM. For example, the SHE-assisted STT-MRAM may reduce the area of the bit cell structure by about 50% relative to a conventional STT-bit cell. In addition, the SHE-assisted STT-MRAM may also facilitate the use of less energy during the write operation and faster write times.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system implemented on a SoC. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations are described herein and illustrated in FIG. 4.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above.

Various modifications, changes and variations may be made in the arrangement, operation and details of the methods and apparatus described above without departing from the scope of the claims.

What is claimed is:

1. An apparatus comprising:
a magnetoresistive random access memory (MRAM), comprising:
a heavy metal layer coupled to a source line; and
a plurality of bit cells coupled to a word line, and a plurality of bit lines, and the heavy metal layer, such that the heavy metal layer is a continuous layer coupling the bit cells to the source line, wherein each of the bit cells comprises a magnetic tunnel junction (MTJ) and a transistor, a gate of the transistor being coupled to the word line, and at least one of a source or a drain of the transistor being coupled to the MTJ or at least one of the bit lines; and
a controller coupled to the MRAM and configured to:
apply a first voltage to at least a portion of the heavy metal layer and a second voltage lower than the first voltage at another portion of the heavy metal layer during a first phase; and
apply a third voltage to the heavy metal layer during a second phase, the third voltage being between the first voltage and the second voltage.

2. The apparatus of claim 1, wherein the controller is configured to write a value to the MTJs via spin Hall effect-assisted spin transfer torque write operations.

3. The apparatus of claim 2, wherein, during the first phase, the controller is configured to apply the first voltage and the second voltage, such that free layers of the MTJs are magnetized via the spin Hall effect of the heavy metal layer as the first and second voltages are applied.

4. The apparatus of claim 3, wherein, during the second phase, the controller is configured to apply the third voltage to the heavy metal layer and a fourth voltage to at least one of the bit lines, such that the free layer of the MTJ coupled to the at least one of the bit lines is magnetized in a first direction relative to a fixed layer of the MTJ coupled to the at least one of the bit lines via spin transfer torque (STT).

5. The apparatus of claim 4, wherein, during the second phase, the controller is configured to apply the third voltage to the heavy metal layer and a fifth voltage to at least one of the bit lines, such that the free layer of the MTJ coupled to the at least one of the bit lines is magnetized in a second direction relative to a fixed layer of the MTJ coupled to the at least one of the bit lines via spin transfer torque (STT).

6. The apparatus of claim 4, wherein the fourth voltage is less than the third voltage, and wherein the controller is configured to apply the first and second voltages before the third and fourth voltages.

7. The apparatus of claim 5, wherein the third voltage is less than the fifth voltage, and wherein the controller is configured to apply the first and second voltages before the third and fifth voltages.

8. The apparatus of claim 1, wherein the heavy metal layer comprises at least one of tantalum (Ta), tungsten (W), or platinum (Pt).

9. The apparatus of claim 1, wherein each free layer of the MTJs is coupled to the heavy metal layer.

10. A method of writing to a magnetoresistive random access memory (MRAM) comprising a plurality of bit cells coupled to a word line, a plurality of bit lines, and a heavy metal layer, such that the heavy metal layer is a continuous layer coupling the bit cells to a source line, the method comprising:
applying, during a first phase, a first voltage to at least a portion of the heavy metal layer and a second voltage lower than the first voltage at another portion of the heavy metal layer, such that free layers of magnetic tunnel junctions (MTJs) of the bit cells are magnetized via a spin Hall effect of the heavy metal layer; and
applying, during a second phase, at least one of:
a third voltage being between the first voltage and the second voltage to the heavy metal layer and a fourth voltage to at least one of the bit lines, such that the free layer of the MTJ coupled to the at least one of the bit lines is magnetized in a first direction relative to a fixed layer of the MTJ coupled to the at least one of the bit lines via spin transfer torque (STT), or
the third voltage being between the first voltage and the second voltage to the heavy metal layer and a fifth voltage to at least one of the bit lines, such that the free layer of the MTJ coupled to the at least one of the bit lines is magnetized in a second direction relative to the fixed layer of the MTJ coupled to the at least one of the bit lines via STT.

11. The method of claim 10, wherein:
the fourth voltage is less than the third voltage,
the third voltage is less than the fifth voltage, and
applying the first and second voltages occurs before applying at least one of the third and fourth voltages or the third and fifth voltages.

* * * * *